United States Patent [19]

Israelsen

[11] Patent Number: 5,031,037
[45] Date of Patent: Jul. 9, 1991

[54] METHOD AND APPARATUS FOR VECTOR QUANTIZER PARALLEL PROCESSING

[75] Inventor: Paul D. Israelsen, North Logan, Utah

[73] Assignee: Utah State University Foundation, Logan, Utah

[21] Appl. No.: 333,976

[22] Filed: Apr. 6, 1989

[51] Int. Cl.⁵ .............................................. H04N 7/13
[52] U.S. Cl. .................................. 358/133; 341/106; 358/136
[58] Field of Search ..................... 358/135, 136, 261.1, 358/133; 341/106; 364/570; 375/122; 382/56; 381/31

[56] References Cited

U.S. PATENT DOCUMENTS

| | | | |
|---|---|---|---|
| 3,540,002 | 11/1970 | Clapper . | |
| 4,084,260 | 4/1978 | Fleming et al. . | |
| 4,613,948 | 9/1986 | Gharavi | 341/106 X |
| 4,800,425 | 1/1989 | Schwerzel et al. | 358/136 |
| 4,811,265 | 3/1989 | Hashimoto et al. . | |
| 4,837,632 | 6/1989 | Kubo et al. | 358/136 |
| 4,868,867 | 9/1989 | Davidson | 381/31 X |
| 4,897,720 | 1/1990 | Wu et al. | 358/136 |
| 4,907,276 | 3/1990 | Aldersberg | 381/31 X |
| 4,922,508 | 5/1990 | Moriya | 358/133 |
| 4,963,030 | 10/1990 | Makur | 358/133 |

OTHER PUBLICATIONS

P. Cappello et al., ICASSP 1986 entitled "A Systolic Vector Quantization Processor for Real-Time Speech Coding".
R. M. Gray et al., 1982 IEEE Transactions on Communications, entitled "Vector Quantizers and Predictive Quantizers for Gauss-Markov Sources".
Y. Linde et al., 1980 IEEE Transactions on Communications entitled "An Algorithm for Vector Quantizer Design".

Primary Examiner—Victor R. Kostak
Attorney, Agent, or Firm—Venable, Baetjer and Howard

[57] ABSTRACT

An electronic circuit for quantizing vector signals is provided. The circuit compares input vectors with codebook entries that are representative of a vector space. Processors simultaneously compute the distance between the image vectors and the codebook entries. Selection circuitry is provided which compares the distance values and generates outputs which are representative of the codebook vector having the smallest distance and the distance itself.

54 Claims, 6 Drawing Sheets

METHOD AND APPARATUS FOR VECTOR QUANTIZER PARALLEL PROCESSING

BACKGROUND OF THE INVENTION

The invention relates to an electronic circuit for quantizing vector signals.

Numerous fields of endeavor make use of vector processing. One newly emerging field is data compression. The preferred embodiment of the invention will be described with particular reference to compression of image signals, though such an illustration is not a limitation on its scope.

A quantizer is a device which represents one signal which can take on a large number of values by another signal which can take on only a limited number of values. A four bit analog-to-digital converter, for example, represents the value of a continuously varying (i.e., analog) signal by a digital signal which can have only one of sixteen values. Scaler quantizers operate on signals having a single degree of freedom, such as an analog-to-digital converter operating on a voltage signal. Vector quantizers operate on signals having multiple degrees of freedom as will be discussed more fully below.

A vector quantizer for compressing video images conceptually divides the image into numerous small areas called pixels (a term formed from the words "picture" and "element"). Pixels are sufficiently small that the intensity of the image is approximately constant across the pixel area. For example, a black and white image of a house might be divided into a grid of 600 rows and 600 pixels per row. Each pixel would be like a small dot in the image. A group of pixels together would form a vector which can be thought of as a small subimage. For which may be a portion of a shadow, or part of the roof line against a light background. Vectors formed from an image shall be called image vectors. The circuit of the present invention operates on vectors which, for the illustrated example, are image vectors. In general, any source of vector signals may be used, and vectors which are subject to quantization are more generally referred to as input vectors.

While a black and white image serves as an example here, vectors might also be formed from red, green, or blue levels from a color image. They might also be formed from Y,I and Q components of a color image, or from transform coefficients of an image signal on which a Hadamard, Fourier, or other transform has operated.

Numerous methods exist for manipulating an image to form image vectors. For example, a television camera might generate an analog video signal in a raster scan format having 600 scan lines per frame. An analog-to-digital converter could then digitize the video signal at a sampling rate of 600 samples per scan line. Digital signal processing equipment can then store the digital samples, and group them into vectors. The process of digitizing an analog video signal is a form of scaler quantization which is similar to but distinct from methods of vector quantization. The discussion which follows assumes that one of many methods well known in the art of signal processing can be used to produce digital image signals.

Before quantizing an image, a vector quantizer stores a set of "codebook" vectors in memory. Codebook vectors are vectors which are chosen to be 30 representative of commonly found image vectors. For example, one codebook vector might be a 6×6 pixel solid black patch. Another codebook vector might have all white pixels in the top three rows, and all black pixels in the bottom three rows. Yet another codebook vector might have a gradient made up of white pixels in the top row, black pixels in the bottom row, and four rows in between having shades of grey which go from light to dark. The quantizer stores a sufficient variety of codebook vectors so that at least one closely matches each of the many vectors that might be found in the full image.

Each codebook vector is assigned a unique identification code. The solid black patch, for example, might be assigned ID code #1. The codebook vector having white pixels in the top half and black pixels in the bottom half might be assigned ID code #2, and so on for hundreds or thousands of codebook vectors. The set of all codebook vectors is called a codebook.

In practice, the identification code for a codebook vector may be an address in a memory which stores the vector values. The precise order of the entries may be arbitrary, or it may be selected according to some property of the vectors.

When quantizing a full image, a vector quantizer divides the full image into a series of image vectors. For each image vector, the vector quantizer identifies one closely matching codebook vector. The vector quantizer then generates a new signal made up of the series of the identification codes of the selected codebook entries. For the example of a full image of a house, the vector quantizer would divide the full image into numerous image vectors. The quantizer might then replace image vectors from shadow areas with ID code #1 (the solid black patch), and it might replace roof line image vectors with ID code #2 (white in the top half and black in the bottom half).

Regeneration of the full image can be accomplished by a device which has the complete codebook stored in memory. The device regenerates the image signal by replacing each ID code in the quantized signal with its corresponding codebook vector. The process is similar to "painting by the numbers." The regenerated image differs from the original image, because codebook entries do not precisely match the original image vectors. The difference is called distortion. Increasing the number of codebook entries decreases distortion.

In mathematical terms, a vector quantizer is a device which maps vectors from a vector space onto a finite set. A pixel from a black and white image is a scaler, because the pixel has only one degree of freedom: intensity. A 6×6 square patch of pixels is a vector, because the square patch has numerous degrees of freedom: the intensities of each of the thirty six pixels. The set of all possible image vectors forms a vector space.

Conceptually, the vector space can be partitioned into a finite number of regions. One vector from each region can be designated as a codebook vector for that region. All possible image vectors exist somewhere in the vector space. Each possible image vector thus lies within one of the regions. In fact, multiple image vectors might occupy the same region. For all image vectors in a given region, the vector quantizer replaces the image vector with an identification code for that region. The vector quantizer thus maps all vectors of the vector space onto a set of identification codes. When regenerating the image, each identification code is replaced with the codebook vector for the corresponding region.

Vector quantizers are developing as useful devices for compressing data. A compressor, as the term is used here, is a device which represents one signal by a second signal from which the original can be derived, but which requires the transmission or recording of less information than the original signal. For example, digitally transmitting a full image ordinarily requires transmitting the intensities of each pixel of each row of the full image. A vector quantizer instead transmits an ID code for each image vector.

A vector quantizer sends fewer bits than would otherwise be sent, because one ID code is a smaller number of bits than all the pixel intensities of the image vector. Suppose, for example, that each pixel intensity in an image is represented by an eight bit binary number (eight bits allows definition of 256 levels of intensity for each pixel). Suppose also that image vectors are made up of thirty six pixels. A vector could thus be represented by 288 bits (8 bits/pixel times 36 pixels equals 288 bits). In addition, suppose that a codebook contains 1024 entries. (Experience has shown that reasonable image quality can be achieved with a codebook of 1024 vectors.) Each of the 1024 entries can by uniquely designated by a ten bit identification code. By replacing each image vector with identification code of a codebook vector, a vector quantizer replaces 288 bits with 10 bits.

Some vector quantizers utilize computers to store codebook vectors in memory. They then employ some form of software program to search the memory for a match between an image vector and a codebook vector. Identifying the codebook vector which most closely matches an image vector requires a significant number of computational steps. The number of computational steps increases linearly with the number of codebook entries. This has created limitations with such quantizers. The lengthy time required to perform the computational steps forces designers to sacrifice image quality for speed, because they must use small codebooks, or vectors of small dimension. Alternatively some designers resort to complicated signal processing in advance of vector quantization in order to reduce the amount of information which must be quantized.

A full codebook search is an example of one straightforward method for selecting the best match between an image vector and the codebook entries. The vector quantizer sequentially compares an input image vector to each and every codebook vector. The vector quantizer computes a measure of distortion for each codebook vector and selects the one having the smallest distortion. A full codebook search ensures selection of the best match (a property called optimality), but involves the maximum number of computational steps. The article by Y. Linde, A Buzo and R. Gray entitled "*An Algorithm for Vector Qunatizer Design,*" *IEEE Transactions on Communications,* Vol. Com-2B, No. 1 (January 1980 describes the full codebook search and the computational steps involved in such a search.

A technique known as a branching search reduces the number of codebook entries which must be evaluated, but U.S. Pat. Nos. 4,558,350 and 4,560,977 disclose vector quantizers using branching searches. The article by R. Gray and Y. Linde entitled "*Vector Quantizers and Predictive Quantizers for Gauss-Markov Sources,*" IEEE Transactions on Communications, Vol. Com-30, No. 2 (Feb. 1982) describes the branching tree search and some of its shortcomings.

The vector quantizer described in Lindsey U.S. Pat. No. 4,727,354 reduces the number of computational steps required to match an input to a codebook vector by eliminating the computation of distortion. The distortion between each codebook vector and all possible input vectors., is calculated in advance and stored in memory. However, such a method requires large amounts of memory relative to other methods.

SUMMARY OF THE INVENTION

A vector quantizing circuit compares input vectors to codebook entries which are representative vectors from a vector space. Processors simultaneously compute the distances between the image vectors and the codebook entries. Selection circuitry compares the distance values and generates outputs which represent the codebook vector having the smallest distance and the distance itself.

DETAILED DESCRIPTION OF THE PREFERRED EMBODIMENT

Figure 1:
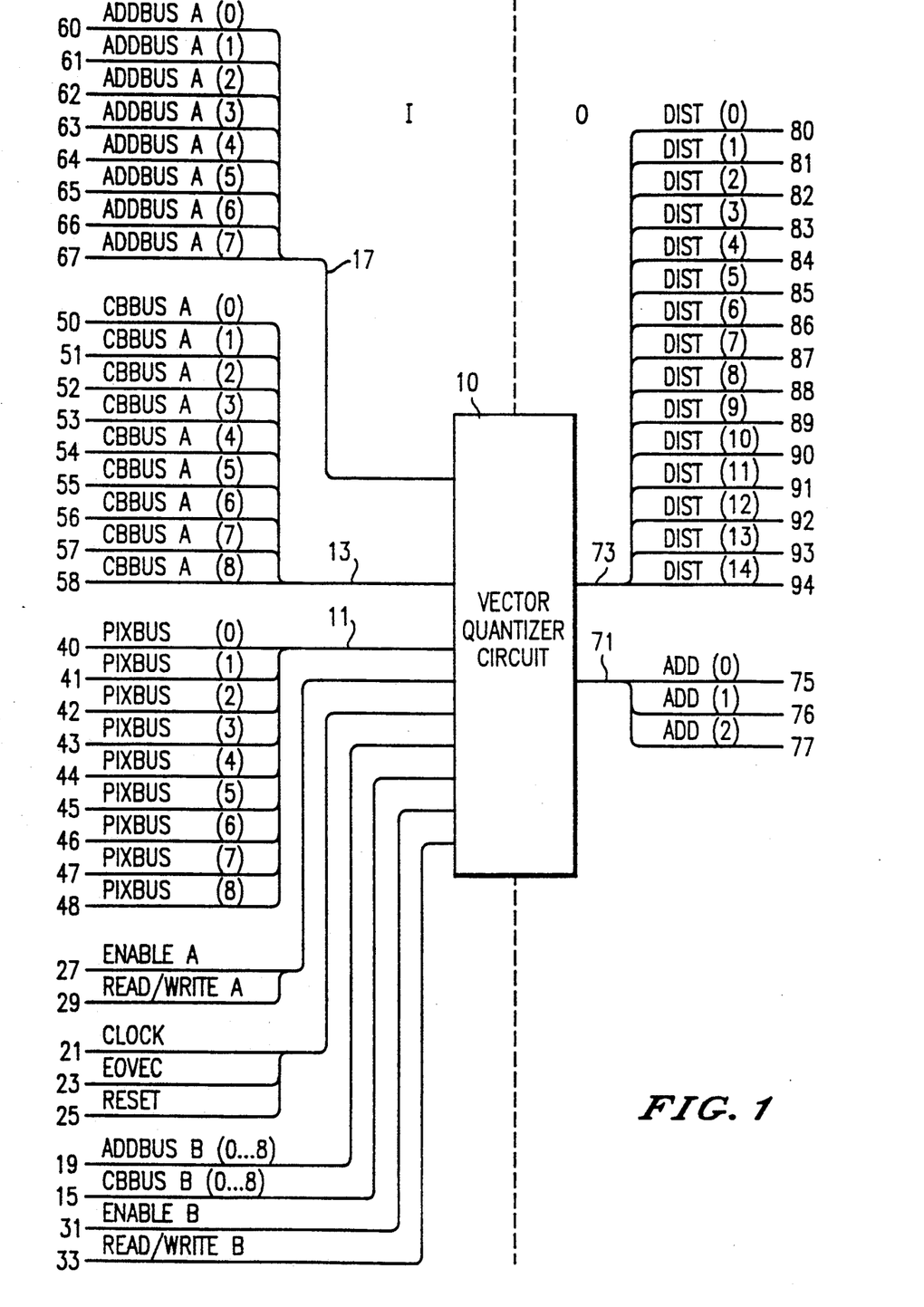
FIG. 1 is a representation of the preferred embodiment of the invention showing input and output signal lines.

The preferred embodiment of the invention 10 is shown in FIG. 1 with input signal lines I and output signal lines 0. The preferred embodiment of the invention is a single integrated circuit fabricated with complimentary Metal Oxide Semiconductor (CMOS) technology. The invention may, however, be fabricated with other semiconductor technologies, such as bipolar, transistor-transistor logic (TTL), emitter-collector logic (ECL), etc. The invention may also be implemented using multiple integrated circuits.

The preferred embodiment is described as operating on image vectors. The invention can also be applied to other data sources, such as voice or other audio signals.

Stated briefly, the circuit 10 compares an image vector to codebook entries. It indicates which codebook vector most closely matches the image vector, and also indicates the distance between the image vector and that codebook vector. Stated another way, the circuit 10 performs the following calculation:

$$d = \sum_i^n |(c_i - p_i)|$$

where $c_i$ are elements of the codebook vector, and $p_i$ are elements of an image vector, and i is the number of pixels in a vector. The value d is one of many possible measures of distance between vectors. Another measure is $$d' = [\Sigma(d_i - p_i)]^{\frac{1}{2}}$$

Other measures may be employed without departing from the present invention.

For example, consider an image vector comprising 36 scaler values: $P = \{p_1, p_2, \ldots, p_{36}\}$. Consider also a set of eight codebook entries:

$$C_1 = \{c_{1,1}, c_{1,2}, \ldots, c_{1,36}\}$$
$$C_2 = \{c_{2,1}, c_{2,2}, \ldots, c_{2,36}\}$$
$$C_3 = \{c_{3,1}, c_{3,2}, \ldots, c_{3,36}\}$$
$$C_4 = \{c_{4,1}, c_{4,2}, \ldots, c_{4,36}\}$$
$$C_5 = \{c_{5,1}, c_{5,2}, \ldots, c_{5,36}\}$$
$$C_6 = \{c_{6,1}, c_{6,2}, \ldots, c_{6,36}\}$$
$$C_7 = \{c_{7,1}, c_{7,2}, \ldots, c_{7,36}\}$$
$$C_8 = \{c_{8,1}, c_{8,2}, \ldots, c_{8,36}\}$$

External circuitry (not shown) loads numeric values for the eight codebook vectors into the circuit 10. Each vector comprises 36 pixel values, and the external circuitry loads one pixel at a time. External circuitry can then present an image vector P to the circuit 10. Image vectors, like codebook entries, comprise 36 pixel values, and the external circuitry presents one pixel 15 from the image vector at a time to the circuit 10. The circuit 10 computes eight distance values $d_1$ through $d_8$, where d is the distance between the image vector P and the first codebook vector $C_1$, $d_2$ is the distance between the image vector and the second codebook vector $C_2$, and so on. In mathematical terms:

$$d_1 = (d_{1,1} - p_2) + (d_{1,2} - p_2) + \ldots + (C_{1,36} - p_{36}),$$

$$d_2 = (c_{2,1} - p_1) + (c_{2,2} - p_2) + \ldots + (c_{2,36} - p_{36}), \text{etc.},$$

wherein $c_{1,i}$ are pixel values of the first codebook vector, $c_{2,i}$ are pixel values of the second codebook vector, and so on.

The circuit 10 then compares the values $d_1$ through $d_8$ to one another and determines which is the smallest. It generates signals on two sets of output. The first indicates which codebook vector had the smallest distance value. The second indicates the distance value itself.

Referring again to FIG. 1, the circuit 10 accepts a number of signals on input lines I, and generates a number of signals on output lines 0. Inputs include:
Pixel Bus signal lines 11;
Codebook A Bus signal lines 13;
codebook B Bus signal lines 15;
Address A Bus signal lines 17;
Address B Bus signal lines 19;
CLOCK signal line 21;
EOVEC signal line 23;
RESET signal line 25;
ENABLE A signal line 27;
READ/WRITE A signal line 29;
ENABLE B signal line 31; and
READ/WRITE B signal line 33;

The Pixel Bus 11 consists of nine parallel signal lines 40-48. Eight of the lines carry a digital value corresponding to the magnitude of one pixel element of an input vector. For example, the pixel bus may carry the digital value of the intensity of one pixel in a 36 pixel input vector. The ninth line indicates the sign of the pixel magnitude. For some applications, vectors may be pre-processed by subtracting the mean value of pixel intensities from each pixel. Such a normalized pixel value could have a positive or negative value relative to the mean.

The Codebook A Bus 13 consists of nine parallel signal lines 50-58. Eight of the lines carry a digital value corresponding to the magnitude of one pixel of a codebook vector. The ninth line indicates the sign of the pixel magnitude.

The Codebook Bus B 15 also comprises nine signal lines (not individually shown) and operates in the same manner as the Codebook Bus A 13. As will be discussed later, the circuit 10 is divided into multiple parts, and the two sets of bus lines allow simultaneous access to different parts of the circuit 10. 35 Address Bus A 17 consists of eight parallel signal lines 60-67 which designate memory locations in the circuit 10. Address Bus B 19 also consists of eight parallel signal lines (not individually shown) and operates in the same manner as the Codebook Bus A signal lines 13. As will be discussed below, two address busses allow simultaneous access to different parts of the circuit 10.

The ENABLE A signal line 27 and the READ/WRITE A signal line 29 provide control signals for use with the Address Bus A 17 and Codebook Bus A 13 signal lines. ENABLE A signal line 27 allows external circuitry to write data to, and read data from memory devices, and can serve as an additional address line in multiple-chip architectures. READ/WRITE A signal line 29 determines whether a storage location designated by the address bus will store data values which have been presented on the codebook or will output previously stored values. ENABLE B signal line 31 and READ/WRITE B signal line 33 provide control signals for use with the Address B signal lines 19 and Codebook Bus B signal lines 15.

The CLOCK signal line 21, the EOVEC signal line 23, and the RESET signal line 25 provide control inputs commonly used throughout the circuit 10. The CLOCK signal line provides timing for all internal processes. EOVEC (end of vector) controls certain processes which only occur after the last pixel of an input vector has been processed. RESET places temporary registers into a known state. These functions will be discussed in detail below.

Output signals include:
Distance signal lines 73, and
Address signal lines 71.

The Address signal lines 71 comprise three parallel signal lines 75-77. The circuit of the preferred embodiment 10 is capable of comparing an image vector to eight codebook vectors simultaneously, and the Address signal lines indicate which of the eight is closest. The Distance signal lines 73 comprise fifteen parallel signal lines 80-94. The Distance signal lines 73 carry a binary representation of the distance between an image vector and the closest codebook vector.

Figure 2:
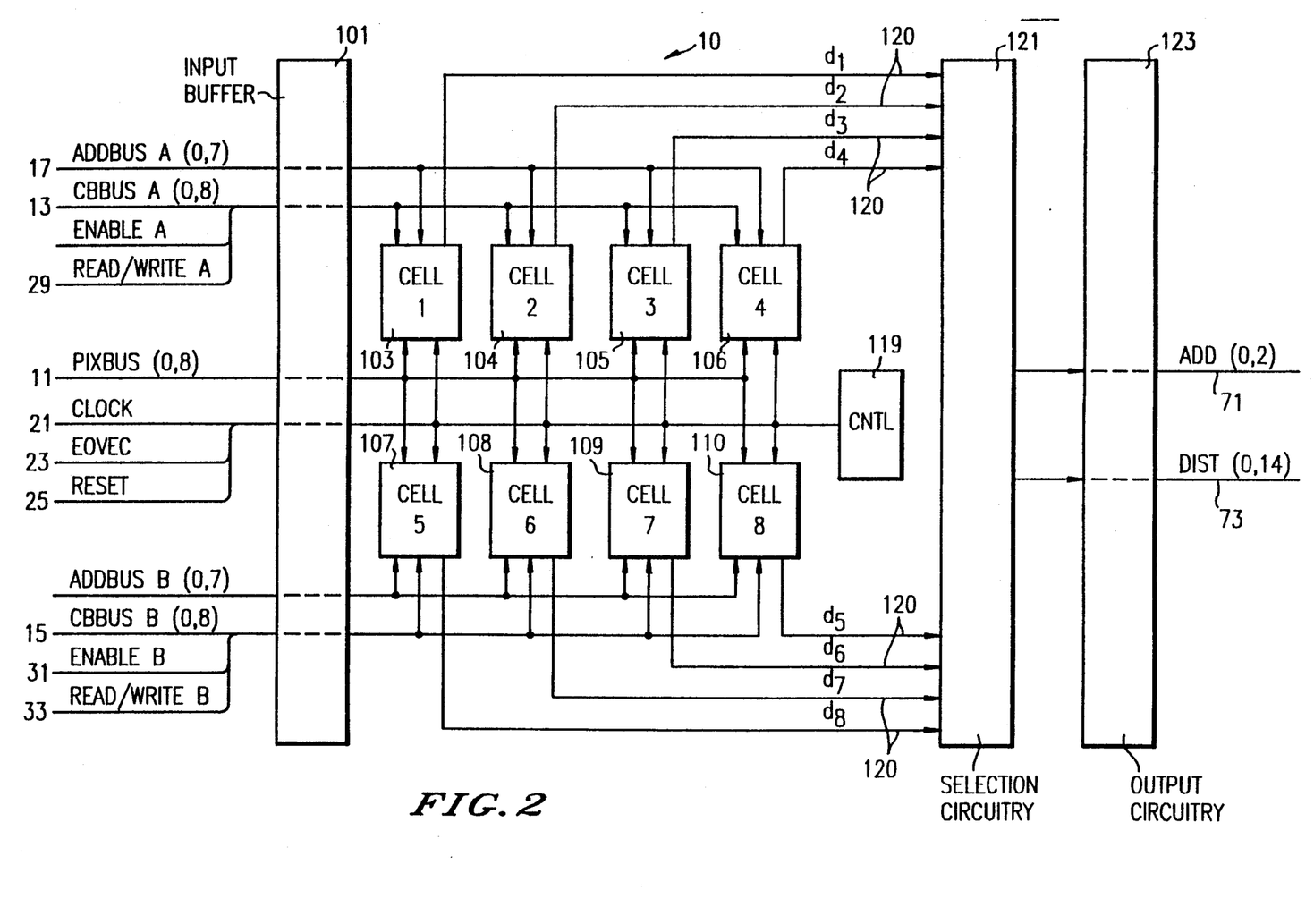
FIG. 2 is a schematic block diagram of the functional groups of the preferred embodiment.

Referring now to FIG. 2, the circuit 10 comprises the following functional groups which are connected to one another as shown: input buffers 101, processors 103-110, common control circuitry 119, selection circuitry 121, and output drivers 123. Four of the processors 103-106 access Codebook Bus A and Address Bus A. The other four processors 107-110 access Codebook Bus B and Address Bus B. Use of the circuit involves two general operations: (1) storing codebook entries, and (2) quantizing image vectors.

The process for storing vectors is the same for the A and B busses, and the A bus will be discussed. Each of the processors 103-106 can store a codebook vector which consists of up to thirty-six pixel values. In order to store a codebook vector, external circuitry (not shown) presents the first pixel of the codebook vector to the circuit 10 on the Codebook Bus A signal lines 13 and a memory address for a desired location within a desired processor 103-106 on the Address Bus A signal lines 17. Input buffers 101 on each input line limit the amount of current which can flow into the circuit. Transitioning the READ/WRITE A signal line 29 and the ENABLE A signal line 27 in a manner described in detail below causes the processor 103-106 to store the pixel value. The external circuitry then selects a new address, presents a new pixel value, and repeats the operation until all thirty-six pixels are stored. External circuitry then repeats the operation for another processor. By using two sets of busses, vectors can be loaded into two processors simultaneously.

By presenting pixels values one at a time, vectors having large dimensions (i.e., large numbers of pixels per vector) can be processed without resort to large numbers of input signal lines. For example, the number of signal lines needed to present a three pixel vector in which each pixel requires nine bits is 27 lines. In order to present both an image vector and codebook vector and still retain the double bus configuration, 1 input lines are required (27 for Codebook Bus A, 27 for Codebook Bus B, and 27 for the image vector.) Input lines for a three pixel vector becomes undesirable, and higher dimension vectors become impracticable.

After loading codebook entries into the processors 103-110 the circuit 10 can quantize an image vector. External Circuitry (not shown) first transitions the RESET signal line 25 which initiates the circuit 10 for a new image vector. External circuitry then presents the first pixel of an image vector to the circuit 10 on the pixel bus signal lines 11. Processors 103-110 latch the pixel and commence distance calculations which will be described in detail below. The external circuitry then sequentially presents the remaining 35 pixels of the image vector. After the external circuitry has presented the last pixel of the image vector, the external circuitry transitions the EOVEC signal line 23 in a manner described in detail below. The processors 103-110 then generate outputs to the Selection Circuitry 121 which are the distances between the image vector and each processor's respective codebook vector. Selection Circuitry 121 compares the eight distances and identifies the smallest. Selection Circuitry 121 then generates two output signals. The first is an Address output 71 indicating which of the processors 103-110 contained the closest codebook vector to the image vector. The second is a Distance output 73 indicating the computed distance. Output drivers 123 serve as interfaces to external circuitry (not shown) which responds to the Address outputs 71 the and Distance outputs 73.

As will be discussed below, storage capacity in the processors 103-110 allows the external circuitry to load new codebook entries into the processors at the same time that the external circuitry is presenting image vectors for quantization.

Figure 3:
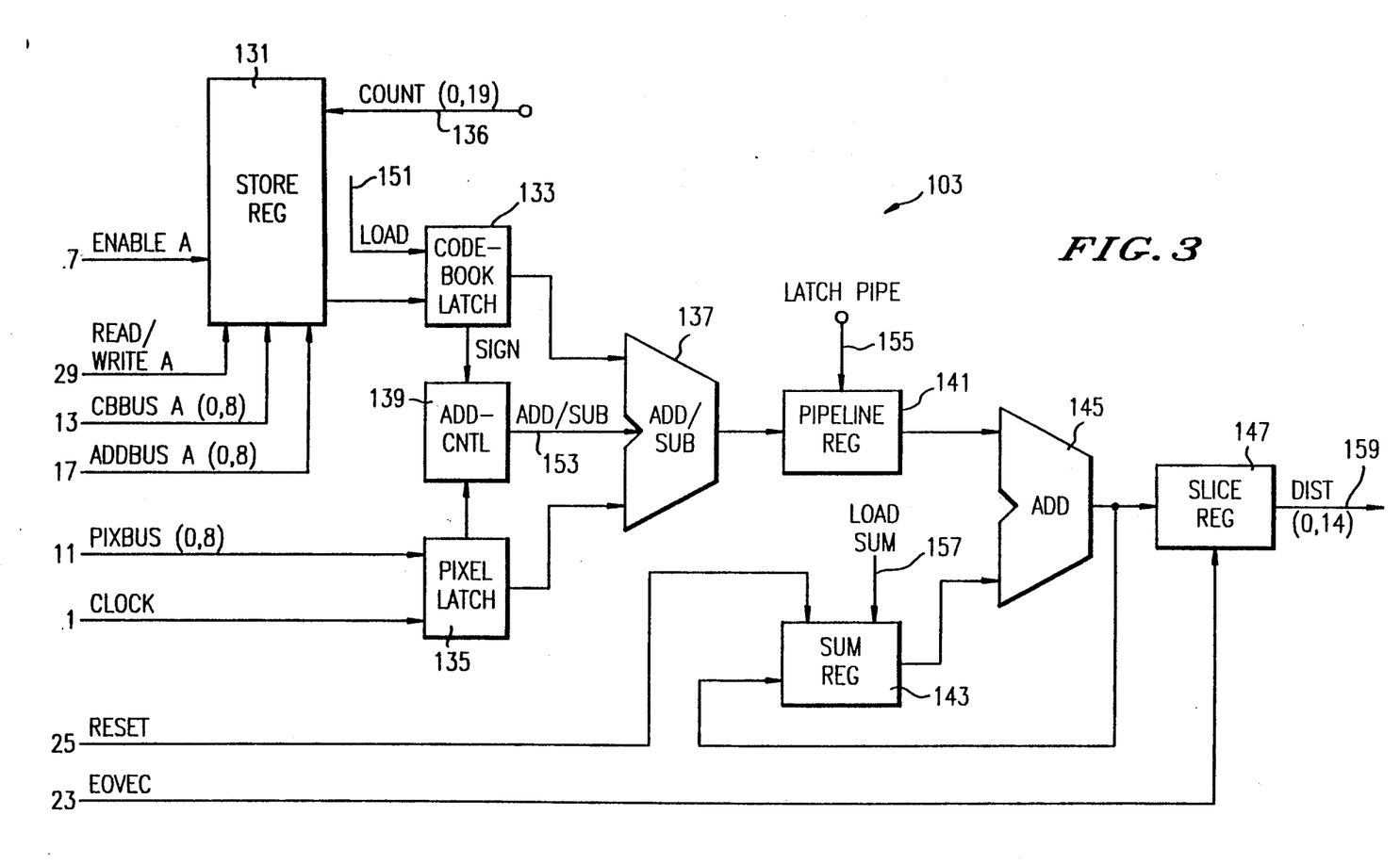
FIG. 3 is a schematic block diagram of the functional elements of one processor of the preferred embodiment.

Each processor 103-110 comprises a number of functional elements connected as shown in FIG. 3: storage register 131, codebook latch 133, pixel latch 135, adder/subtractor 137, adder-controller 139, pipeline register 141, summation register 143, adder 145, and slice register 147. Operations will be described for a the first processor 103 accessed by the Codebook Bus A signal lines 13 and the Address Bus A signal lines 17. Operation of other processors is similar.

Before processing any input vector, a codebook vector is stored into storage register 131. The store register 131 is essentially a three-port memory having one write and two read ports. External circuitry (not shown) can read to and write from the store register 131 using the Codebook Bus A signal lines [O,B] lines 13, the Address Bus A [0,7] signal lines 17, the Enable A signal line 27 and the Read/Write A signal line 29. Common control circuitry 119 (FIG. 2) can independently read codebook vectors from the register 131.

The storage process proceeds as follows. With the Enable A signal line 27 in a low state (less than approximately 0.5 V), external circuitry (not shown) places an address for the first storage location in the processor on the Address A bus signal lines 17, and places the first pixel value of the codebook vector on the Codebook Bus A signal lines 13. External devices then transition the Read/Write A signal line 29 from a high to a low state (approximately 0.25 V), and then return the Read/Write A signal line 29 to a high state. The process then repeats for each of the 36 codebook vector elements by supplying new addresses and data for each pixel in the codebook vector After storing codebook entries, image vectors can be quantized. The processor 103 computes the following distance value:

$$d = \sum_{i=1}^{36} |(c_i - p_i)|$$

where d is the distance measure, $c_i$ are the scaler components of the codebook vector in the processor 103, and $p_i$ are the scaler components of the image vector. The processor 103 accomplishes this computation by (1) loading codebook pixel values and image vector pixel values (2) computing the difference between the two pixel values, and (3) accumulating the thirty six difference values into a total.

External circuitry (not shown) presents the first pixel value of the image vector on the Pixel Bus signal lines 11. The pixel latch 135 loads the pixel value on the next rising edge of the CLOCK signal line 21. At approximately the same time, common control circuitry 119 (FIG. 1) generates an address on the count signal lines 136. The store register 131 will then present one codebook vector pixel value to the codebook latch 133. Common control circuitry 119 (FIG. 1) will generate a signal on the load signal line 151 to load the pixel value into the codebook latch 133.

The processor performs two's compliment arithmetic on the pixel values of the image vector and codebook vector. Values in the codebook latch 133 and the pixel latch 137 may have either positive or negative signs. Values of the same sign must be subtracted one from the other. Values of different signs must be added to each other. Adder controller 139 compares the sign bits of the input pixel and the codebook pixel and generates an add/subtract signal on the add/subtract signal line 153.

The results of the addition/subtraction for all thirty six pixels must be accumulated to generate the total value of the vector distance. Pipeline register 141, sum register 143, and adder 145 perform the accumulation. Initially, external circuitry transitions the reset signal line 25 which places a zero value in the sum register 143. After computing the difference between the first pixels of the image vector and the first pixel of the codebook vector, common control circuitry 9 (FIG. 1) generates a latch pipeline signal on the latch pipe signal line 155 to load that difference value into the pipeline register 141. The adder 145 adds the value in the pipeline register 155 to the value stored in the sum register 143 (initially zero). Common control circuitry 9 (FIG. 1) generates a load sum signal on the load sum signal line 157 to load the output of the adder 145 into the sum register 143.

After the common control circuit 9 (FIG. 1) has updated the sum register 143, external circuitry (not shown) can present the second pixel of the image vector to the Pixel Bus signal lines 11. In a manner similar to the first pixels, the values of the second pixels of the image vector and codebook vector are loaded into the pixel latch 137 and codebook latch 133 respectively. Common control circuitry 9 (FIG. 1 )again loads the value of the adder/subtractor output into the pipeline register 155. Adder 145 adds the difference value to the sum register 143 (which now holds the difference value from the first pixels). Common control circuit 9 (FIG. 1) updates the sum register 143 with the accumulated total.

The process repeats for all thirty six pixels External circuitry repeatedly presents new pixels and addresses the Pixel Bus signal lines 11 and Address Bus A signal lines 17 respectively. The differences accumulate in the sum register 143.

After processing the last pixel, external circuitry (not shown) presents a high signal to the EOVEC (end of vector) signal line 23. This signal loads the accumulated difference value to the slice register 147. The slice register 147 then generates an output on the Distance signal lines 159 which indicates the accumulated difference. The external circuitry then presents a high signal to the RESET input line to clear the latches and registers. The RESET signal does not clear the store register 131 which hold the codebook vector pixel values.

Figure 4:
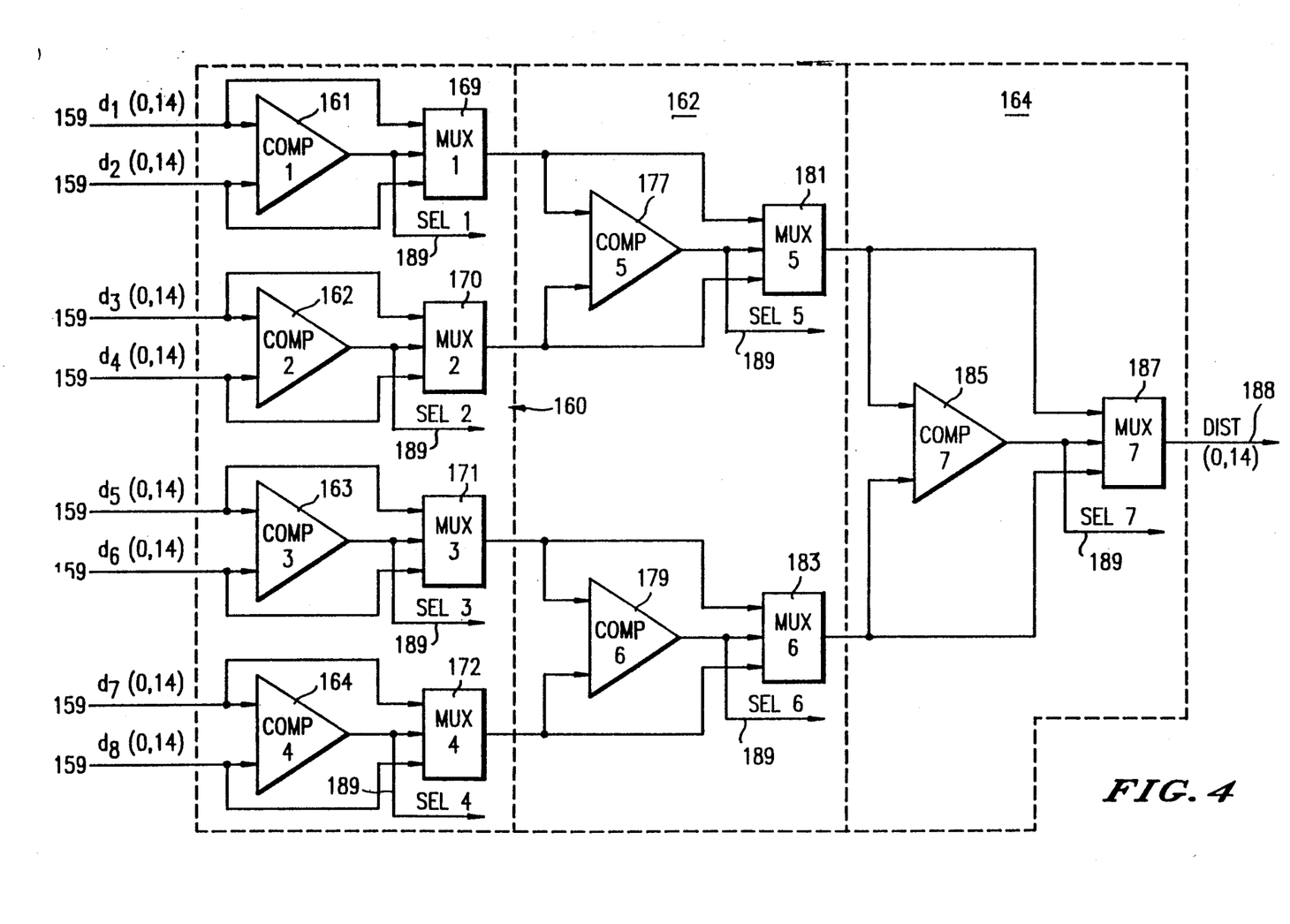
FIG. 4 is a schematic block diagram of a portion of the selection circuitry of the preferred embodiment which identifies the processor containing the best match to an input vector.
Figure 5:
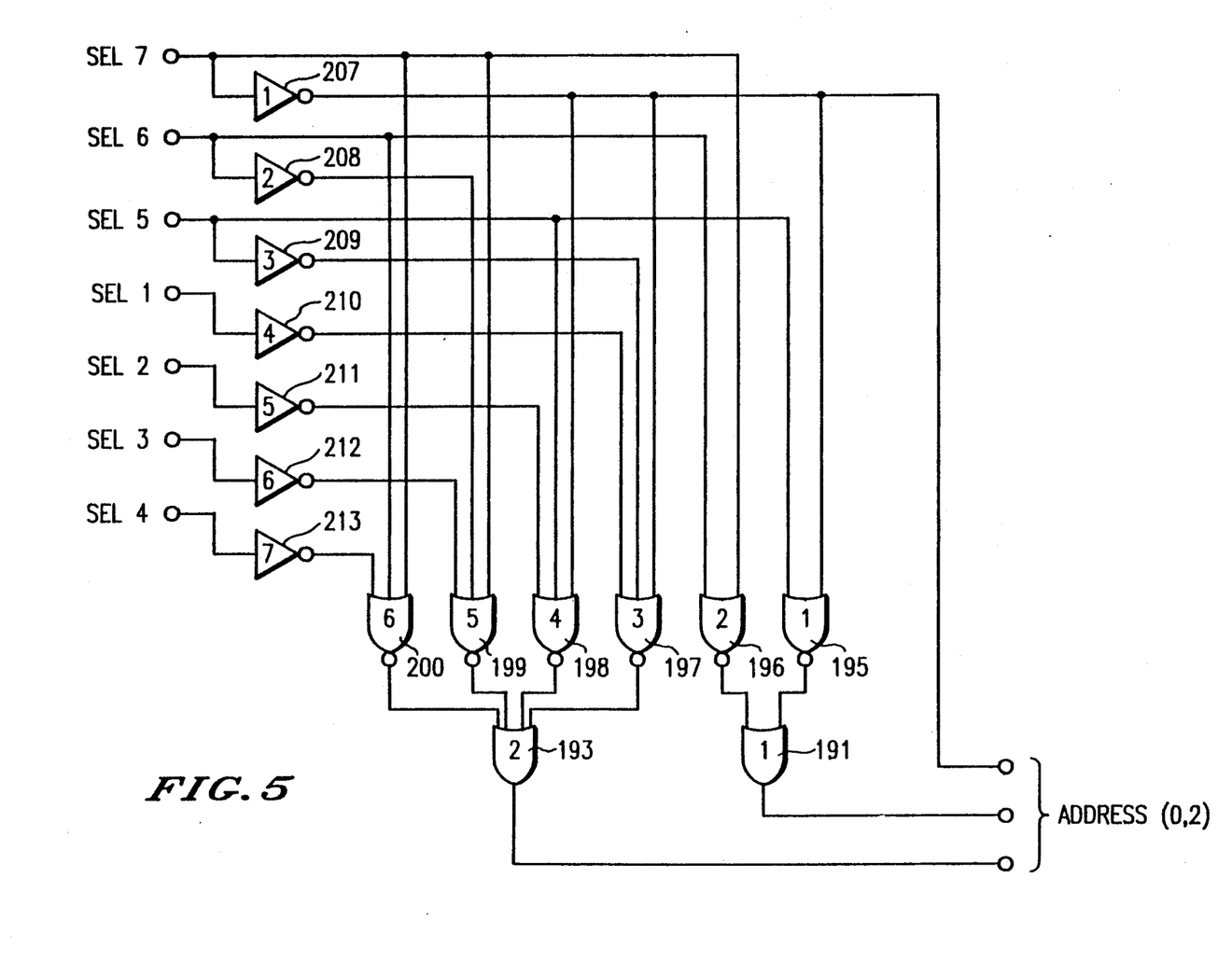
FIG. 5 is a block diagram of a portion of the selection circuitry of the preferred embodiment which generates the address of the processor containing the best match to an input vector.

All of the processors 103-110 simultaneously compute the distance values between the image vector and their respective codebook entries. Referring again to FIG. 2, selection circuitry 121 compares the distances $d_1$-$d_8$ computed by the processors 103-110 and identifies the processor whose computed difference is the smallest (which is, by definition, the processor whose codebook vector is the closest to the image vector). FIGS. 4 and 5 show functional elements of the selection circuitry 121.

Referring specifically to FIG. 4, three cascades of comparators and multiplexers 160, 162, 164 identify the smallest of the eight distance values. Four comparators 161-164 and four multiplexers 169-172 form the first stage 160. Two comparators 177, 179 and two multiplexers 181, 183 form the second stage 162. A single comparator 185 and a single multiplexer 187 form the final stage of the cascade 164.

Eight sets of Distance signal lines 159 present calculated distance values to the first cascade 160. The first stage 160 makes a pair-wise comparison of the values and eliminates the larger distances from each pair. Each comparator 161-164 of the first cascade 160 compares two distance values and generates a select signal 189 designating one distance as the smaller value. Each select signal 189 controls a multiplexer 169-172 which passes the smaller distance signal on to the second stage of the cascade 162. Each select signal 189 also serves as an input to the circuitry of FIG. 5 for generating an address of the processor having smallest distance.

The second stage of the cascade 162 makes a pairwise comparison of distance values passed from the first stage 160 and eliminates the larger distances from each pair. Each comparator 177, 179 of the second cascade 162 compares two of the distance values and generates a select signal 189 designating one distance as the smaller value. Each select signal 189 controls a multiplexer 181, 183 which passes the smaller distance signal on to the final stage of the cascade 164. Each select signal 189 also serves as an input to the circuitry of FIG. 5 for generating an address of the processor having smallest distance.

The third stage of the cascade 164, makes a pairwise comparison of distance values passed from the second stage 62 and eliminates the larger distance. The comparator 185 of the third cascade 164 compares the distance values and generates a select signal 189 designating one as the smaller value. The select signal 189 controls a multiplexer 189 which passes the distance signal on to the output circuitry 123 (FIG. 2). This signal is the distance between the input vector and the closest codebook vector of the eight processors 103-110. The select signal 189 also serves as an input to the circuitry of FIG. 5 for generating an address of the processor 103-110 having smallest distance.

Referring now to FIG. 5, a set of OR gates 191, 193, NOR gates 195-200, and invertors 207-213 generate a three bit address from the seven select signals 189 generated by the seven comparators 161-164,177,179,185 (FIG. 4). The combination of gates forms the boolean algebraic expression for the selected processor 103-110. For example, the set of seven select lines 189 take on a unique set of values depending on which distance value was the smallest. It is desired that the set of three Address signal lines 71 takes on a unique set of values. One can generate an equation relating the state of each Address signal line 71 in terms of the select signal lines 189 by generating a "truth table". The circuit of FIG. 5 is a "realization" of the algebraic equations. Referring again to FIG. 2, output circuitry 123 serves as an interface between the selection circuitry 121 and external devices (not shown). Drivers (not individually shown) on output lines generate the current necessary to activate external devices (typically up to milliamp levels) at appropriate voltages (typically up to 5 volt levels).

Figure 6:
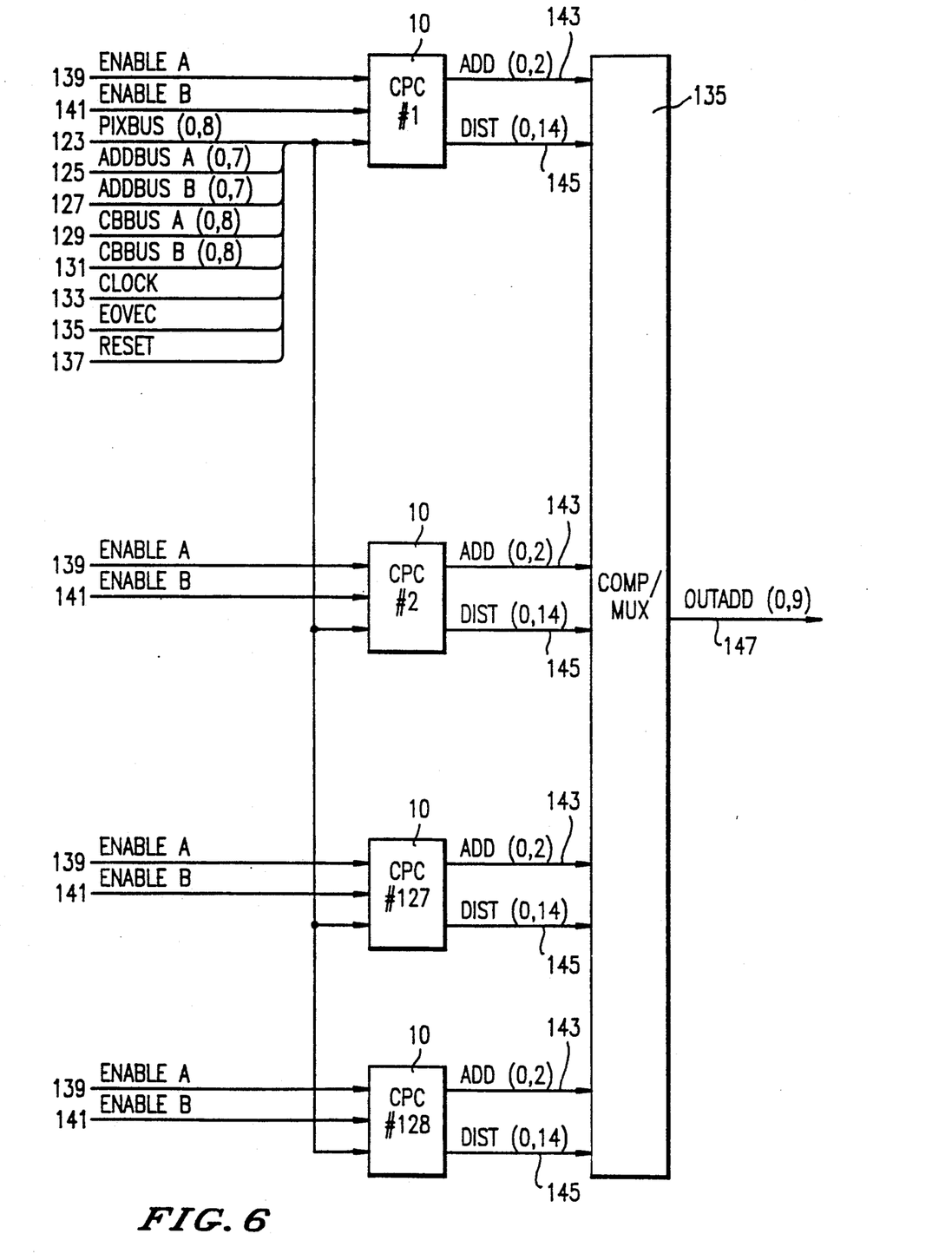
FIG. 6 is a schematic block diagram of a group of circuits in accordance with the preferred embodiment configured to perform a full codebook search.

Circuits of the present invention may be combined to process vectors. FIG. 6 is a schematic block diagram of one such combination for performing a full search on a codebook containing 1024 codebook entries. One hundred twenty eight codebook processor circuits (CPC) 10 of the present invention operate in parallel with each other. Each circuit 10 is capable of processing eight codebook entries. The Pixel Bus signal lines 123 are connected in parallel so that a pixel from an image vector may be simultaneously presented to all circuits 10. Address Bus A signal lines 125, Codebook Bus A signal lines 129, Address Bus B signal lines 127, Codebook Bus B signal lines 131, CLOCK 133, EOVEC 135, and RESET 137 signal lines are also connected in parallel. Enable A 139 and Enable B 141 signal lines for each circuit 10 may be individually controlled to designate individual chips for storing codebook entries. All circuits 10 operate in parallel, with each circuit 10 capable of selecting one codebook vector as the closest of the eight it has stored. Output Address signal lines 131 and Output Distance signal lines 133 from each circuit 121 connect to a comparator/multiplexer (Comp/Mux) circuit 135. The 4. The Comp/Mux circuit has eight levels of cascade, whereas the circuit of FIG. 4 has only three levels of cascade 160,162,164. Comp/Mux circuit 135 identifies the one address within one of the circuits 10 which has the closest codebook vector to the image vector. The compare/multiplexer 135 generates an output indicating that ten-bit address. The output is ten bits, because ten bits are required to uniquely identify one of 1024 codebook entries.

While the invention has been described in connection with specific embodiments thereof, it will be understood that it is capable of further modifications. This application is intended to cover any variations, uses or adaptations of the invention following, in general, the principles of the invention, and including such departures from the present disclosure as come within known and customary practice within the art to which the invention pertains.

What is claimed is:

1. A circuit for quantizing multi-component vectors, comprising:
    (a) means responsive to an input vector and a plurality of codebook vectors for implementing a full search of the codebook by simultaneously computing distance values between the input vector and each of the plurality of codebook vectors, and
    (b) means responsive to the simultaneously computed distance values for identifying the smallest distance value.

2. A circuit in accordance with claim 1 further comprising means for generating an output indicative of the codebook vector having the smallest distance value.

3. A circuit in accordance with claim 1 further comprising a means for generating an output representative of the identified smallest distance value.

4. A circuit in accordance with claim 1 in which the means for computing distance values between the input vector and each codebook entry comprises a plurality of processor means, each processor means being capable of computing a distance value between the input vector and one of the plurality of codebook vectors.

5. A circuit in accordance with claim 4 in which the processor means comprises:
    (a) means for storing component values of a codebook vector,
    (b) means for storing component values of an input vector, and
    (c) arithmetic means for computing a distance value between the input vector and the codebook vector.

6. A circuit in accordance with claim 5 in which the arithmetic means comprises:
    (a) means for computing an arithmetic relationship between corresponding component values of the input vector and the codebook vector, and
    (b) means for combining the computed relationships into a distance value.

7. A circuit in accordance with claim 6 in which the arithmetic relationship is the absolute value of the difference between corresponding component values of the input vector and the codebook vector.

8. A circuit in accordance with claim 5 in which the distance value is the sum of the absolute values of the differences between component values of the input vector and the codebook vector.

9. A circuit in accordance with claim 5 in which stored component values of a codebook vector can be replaced.

10. A circuit in accordance with claim 8 in which stored component values of a codebook vector can be replaced during the time period when the arithmetic means is computing the arithmetic relationships.

11. A circuit in accordance with claim 5 in which the means for storing components of the codebook vector includes a latch for storing at least one component value of the codebook vector.

12. A circuit in accordance with claim 5 in which the means for storing component values of the codebook vector includes a register for simultaneously storing a plurality of components of the codebook vector.

13. A circuit in accordance with claim 5 in which the means for storing component values of the input vector includes a latch for at least one component value of the input vector.

14. A circuit in accordance with claim 5 in which the means for computing an arithmetic relationship between corresponding component values of the input vector and the codebook vector includes means capable of adding together or subtracting from one another the corresponding component values.

15. A circuit in accordance with claim 6 in which the means for combining the computed relationships is an accumulator.

16. A circuit in accordance with claim 14 in which the accumulator includes an adder.

17. A circuit in accordance with claim 14 in which the accumulator includes a register for storing an accumulated sum.

18. A circuit in accordance with claim 1 in which the means responsive to the simultaneously computed distance values for identifying the smallest distance value includes at least one comparator.

19. A circuit in accordance with claim 1 in which the means responsive to the simultaneously computed distance values for identifying the smallest distance value includes at least one multiplexer.

20. A circuit in accordance with claim 2 in which the means for generating an output indicative of the codebook vector for which the smallest distance value was computed includes at least one logic gate.

21. A vector quantizing circuit in accordance with claim 1 for receiving and processing individual components of a multi-component vector.

22. A vector quantizing circuit in accordance with claim 1 for receiving and processing vectors having a dimension greater than three (3).

23. A system for quantizing multi-component vectors comprising a plurality of circuits, each of said circuits being in accordance with the circuit of claim 1.

24. A system in accordance with claim 23 further comprising means for generating an output indicative of the circuit having computed the smallest distance value.

25. A circuit for quantizing multi-component vectors, comprising:
    (a) means responsive to an input vector and a plurality of codebook vectors for simultaneously computing distance values between the input vector and each codebook vector, and
    (b) means responsive to the simultaneously computed distance values for identifying the smallest distance value comprising a cascade of sets of comparators and multiplexers operating so that each set in the cascade makes pair-wise comparisons of the simultaneously computed distance values, and passes the smaller value of each pair-wise comparison to the next set in the cascade.

26. A method for quantizing multi-component vectors, comprising the following steps:
    (a) implementing a full search of a codebook containing a plurality of codebook vectors by substantially simultaneously computing distance values between an input vector and each of the plurality of codebook vectors, and
    (b) identifying the smallest distance value.

27. A method in accordance with claim 26 further comprising a step for indicating the codebook vector for which the smallest distance value was computed.

28. A method in accordance with claim 26 further comprising a step for indicating the smallest distance value.

29. A method in accordance with claim 26 in which the step for computing distance values comprises a plurality of processing operations in which each processing operation computes a distance value between the input vector and one codebook vector.

30. A method in accordance with claim 29 in which each processing operation comprises the following steps:
    (a) storing component values of a codebook vector,
    (b) storing component values of an input vector,
    (c) combining the stored component values to compute a distance value between the input vector and the codebook vector.

31. A method in accordance with claim 30 in which the step for computing a distance value between the the input vector and the codebook vector comprises the following steps:
    (a) computing arithmetic relationships between corresponding component values of the input vector and the codebook vector, and
    (b) combining the computed relationships into a distance value.

32. A method in accordance with claim 31 in which the arithmetic relationship is the absolute value of the difference between a component value of the input vector and the corresponding component value of the codebook vector.

33. A method in accordance with claim 31 in which the distance value is the sum of the absolute values of the differences between corresponding component values of the input vector and the codebook vector.

34. A vector quantizing circuit in accordance with claim 33 for receiving and processing vectors having a dimension greater than three (3).

35. A circuit for quantizing multi-component vectors, comprising:
    (a) means responsive to an input vector and a plurality of codebook vectors for implementing a full search of the codebook by substantially simultaneously computing distance values between the input vector and each of the plurality of codebook vectors,
    (b) means responsive to the computed distance values for identifying the smallest distance value, and
    (c) means for generating an output indicative of the smallest distance value.

36. A circuit in accordance with claim 35 further comprising means for generating an output indicative of the codebook vector for which the smallest distance value to the input vector was computed.

37. A circuit in accordance with claim 35 in which the means for computing distance values between the input vector and each codebook entry comprises a plurality of processor means being, each processor means capable of computing a distance value between the input vector and one of the plurality of codebook vectors 38. A circuit in accordance with claim 37 in which the processor means comprises:
    (a) means for storing component values of a codebook vector,
    (b) means for storing component values of an input vector, and
    (c) arithmetic means for computing a distance value between the input vector and the codebook vector.

39. A circuit in accordance with claim 38 in which the arithmetic means comprises:
    (a) means for computing an arithmetic relationship between corresponding component values of the input vector and the codebook vector, and
    (b) means for combining the computed relationships into a total distance value.

40. A circuit in accordance with claim 39 in which the arithmetic relationship is the absolute value of the difference between corresponding component values of the input vector and the codebook vector.

41. A circuit in accordance with claim 38 in which the distance value is the sum of the absolute values of the differences between corresponding component values of the input vector and the codebook vector.

42. A circuit in accordance with claim 38 in which stored component values of a codebook vector can be replaced.

43. A circuit in accordance with claim 38 in which stored component values of a codebook vector can be replaced during the time period when the arithmetic means is computing the arithmetic relationships.

44. A circuit in accordance with claim 387 in which the means for storing component values of the codebook vector includes a register for simultaneously storing a plurality of components of the codebook vector.

45. A circuit in accordance with claim 38 in which the means for storing component values of the input vector includes a latch for at least one component value of the input vector.

46. A circuit in accordance with claim 38 in which the means for computing an arithmetic relationship between corresponding component values of the input vector and the codebook vector includes means capable of adding together or subtracting from one another the corresponding component values.

47. A circuit in accordance with claim 39 in which the means for combining the computed relationships is an accumulator.

48. A circuit in accordance with claim 47 in which the accumulator includes an adder.

49. A circuit in accordance with claim 47 in which the accumulator includes a register for storing an accumulated sum.

50. A circuit in accordance with claim 35 in which the means responsive to the computed distance values for identifying the smallest distance value includes comparators.

51. A circuit in accordance with claim 35 in which the means responsive to the computed distance values for identifying the smallest distance value includes multiplexers.

52. A circuit in accordance with claim 36 in which the means for generating an output indicative of the codebook vector for which the smallest distance value was computed includes logic gates.

53. A system for quantizing multi-component vectors comprising a plurality of circuits, each of said circuits being in accordance with the circuit of claim 35.

54. A circuit for quantizing multi-component vectors, comprising:

(a) means responsive to an input vector and a plurality of codebook vectors for computing distance values between the input vector and each codebook vector;

(b) means responsive to the computed distance values for identifying the smallest distance value comprising a cascade of sets of comparators and multiplexers operating so that each set n the cascade makes a pair-wise comparison of the computed distance values and passes the smaller value of each pair-wise comparison to the next set in the cascade; and (c) means for generating an output indicative of the smallest distance value.

* * * * *